United States Patent
Kim et al.

(10) Patent No.: US 10,490,617 B2
(45) Date of Patent: Nov. 26, 2019

(54) ORGANIC LIGHT EMITTING DISPLAY DEVICE AND A METHOD OF MANUFACTURING THE SAME

(71) Applicant: SAMSUNG DISPLAY CO., LTD., Yongin-si, Gyeonggi-Do (KR)

(72) Inventors: Sunghwan Kim, Yongin-si (KR); Junhyun Park, Suwon-si (KR); Kyoungju Shin, Hwaseong-si (KR); Ansu Lee, Seoul (KR); Byunggeun Jun, Seoul (KR); Chongchul Chai, Seoul (KR)

(73) Assignee: SAMSUNG DISPLAY CO., LTD., Yongin-si, Gyeonggi-Do (KR)

( * ) Notice: Subject to any disclaimer, the term of this patent is extended or adjusted under 35 U.S.C. 154(b) by 77 days.

(21) Appl. No.: 15/689,050

(22) Filed: Aug. 29, 2017

(65) Prior Publication Data
US 2018/0061922 A1 Mar. 1, 2018

(30) Foreign Application Priority Data
Aug. 29, 2016 (KR) ........................ 10-2016-0110171

(51) Int. Cl.
| | |
|---|---|
| *H01L 27/32* | (2006.01) |
| *H01L 27/12* | (2006.01) |
| *H01L 29/786* | (2006.01) |
| *H01L 51/56* | (2006.01) |

(52) U.S. Cl.
CPC ...... *H01L 27/3262* (2013.01); *H01L 27/1251* (2013.01); *H01L 27/1255* (2013.01); *H01L 27/3265* (2013.01); *H01L 29/7869* (2013.01); *H01L 51/56* (2013.01); *H01L 2227/323* (2013.01)

(58) Field of Classification Search
CPC ............ H01L 27/3262; H01L 27/1251; H01L 27/1255; H01L 27/3265; H01L 29/7869; H01L 51/56
USPC .......................................................... 257/40
See application file for complete search history.

(56) References Cited

U.S. PATENT DOCUMENTS

| | | | |
|---|---|---|---|
| 2003/0147018 A1* | 8/2003 | Sano | G02F 1/13454 349/42 |
| 2006/0043527 A1 | 3/2006 | Kwak | |
| 2007/0278480 A1 | 12/2007 | Hwang et al. | |
| 2009/0160741 A1 | 6/2009 | Inoue et al. | |

(Continued)

FOREIGN PATENT DOCUMENTS

KR   1020150100462   9/2015

*Primary Examiner* — Dzung Tran
(74) *Attorney, Agent, or Firm* — F. Chau & Associates, LLC

(57) ABSTRACT

An organic light emitting device includes an organic light emitting diode including an anode and a cathode, a driving transistor including a first semiconductor layer, wherein the driving transistor is electrically connected to the anode of the organic light emitting diode, and a control transistor including a second semiconductor layer including a different material from the first semiconductor layer and configured to control the driving transistor. The first semiconductor layer includes a first channel part, and first and second contact parts, and the second semiconductor layer includes a second channel part, and third and fourth contact parts. One of the first and second contact parts directly contacts one of the third and fourth contact parts.

20 Claims, 15 Drawing Sheets

(56) References Cited

U.S. PATENT DOCUMENTS

| | | | |
|---|---|---|---|
| 2010/0019996 A1 | 1/2010 | You et al. | |
| 2010/0182223 A1* | 7/2010 | Choi | G09G 3/3233 |
| | | | 345/76 |
| 2011/0049523 A1 | 3/2011 | Choi et al. | |
| 2011/0079784 A1* | 4/2011 | Im | H01L 27/3262 |
| | | | 257/59 |
| 2013/0002616 A1* | 1/2013 | Kim | H01L 29/78615 |
| | | | 345/204 |
| 2015/0053935 A1 | 2/2015 | Gupta et al. | |
| 2015/0123084 A1* | 5/2015 | Kim | H01L 27/326 |
| | | | 257/40 |
| 2016/0064465 A1* | 3/2016 | Oh | H01L 27/3262 |
| | | | 257/43 |
| 2017/0062545 A1* | 3/2017 | Oh | H01L 27/3276 |

* cited by examiner

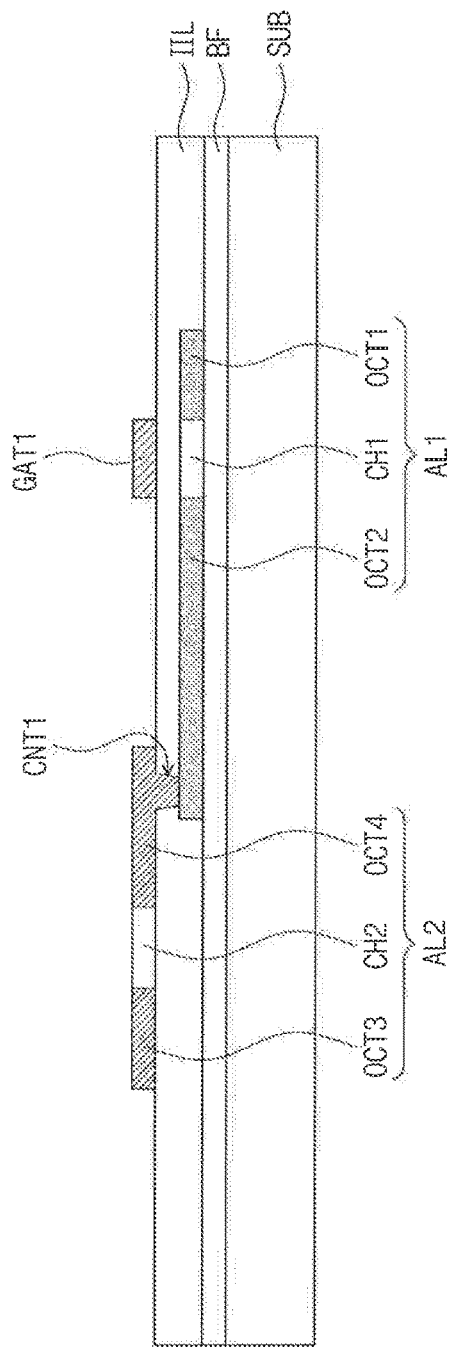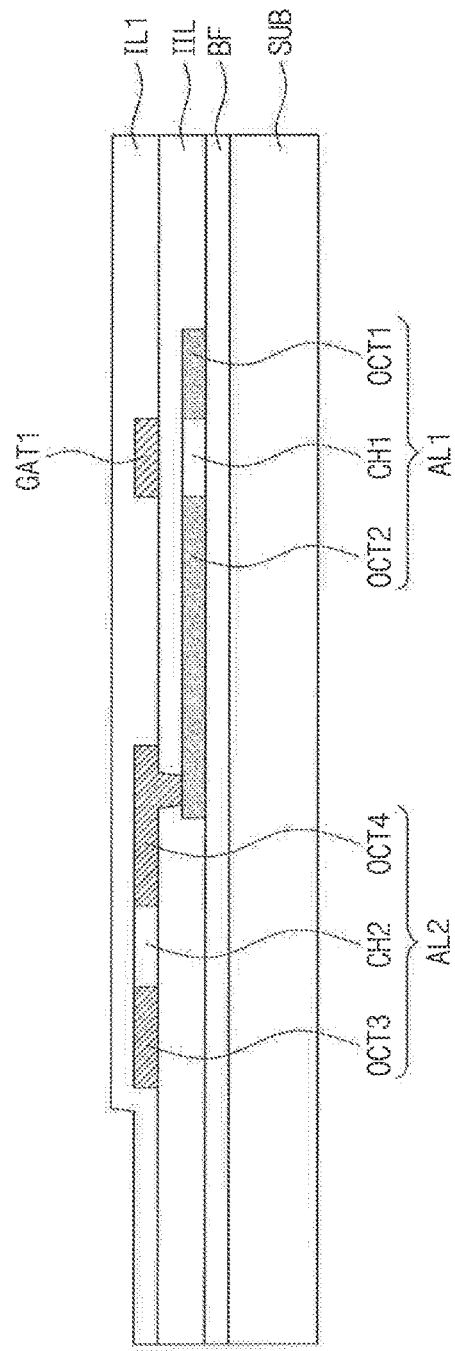

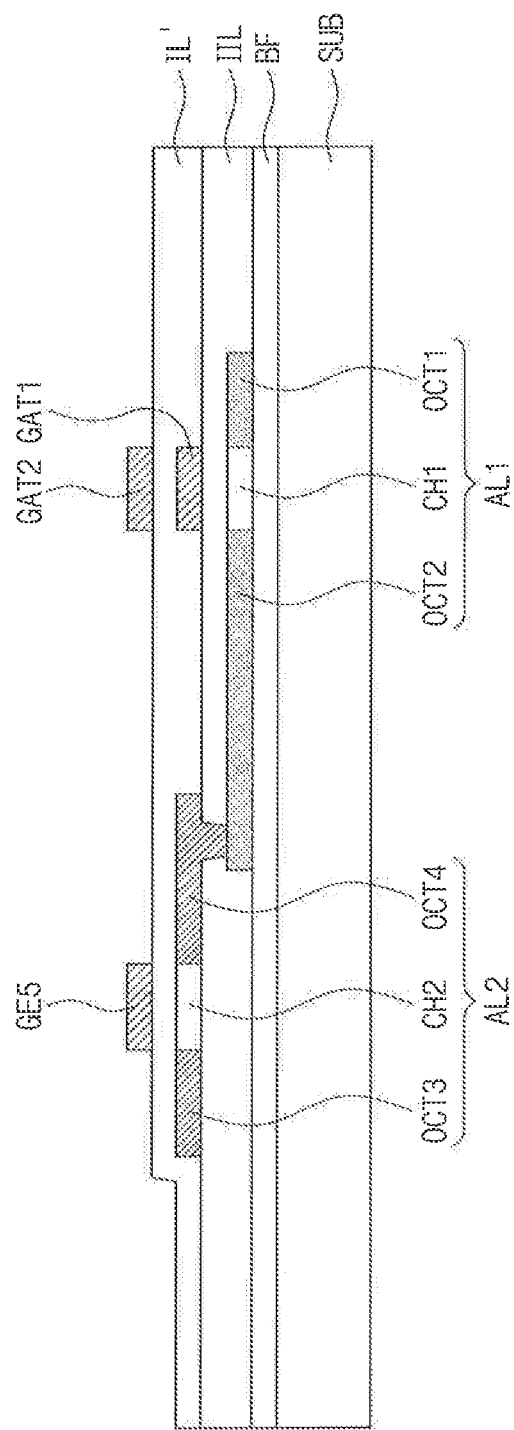

ORGANIC LIGHT EMITTING DISPLAY DEVICE AND A METHOD OF MANUFACTURING THE SAME

CROSS-REFERENCE TO RELATED APPLICATION

This U.S. non-provisional patent application claims priority under 35 U.S.C. § 119 to Korean Patent Application No. 10-2016-0110171, filed on Aug. 29, 2016, the disclosure of which is incorporated by reference herein in its entirety.

TECHNICAL FIELD

The present inventive concept disclosed herein relates to a display device and a method of manufacturing the same, and more particularly, to an organic light emitting device using two types of transistors in a pixel and a method of manufacturing the organic light emitting device.

DISCUSSION OF RELATED ART

An organic light emitting display device includes a plurality of pixels. Each of the pixels includes an organic light emitting diode and a circuit unit for controlling the organic light emitting diode.

The organic light emitting diode includes an anode, a cathode, and an organic light emitting layer disposed between the anode and the cathode. The organic light emitting diode emits light when a voltage greater than a threshold voltage is applied to the organic light emitting layer. In other words, the organic light emitting layer emits light in response to an electric current.

The circuit unit includes at least a control transistor, a driving transistor, and a storage capacitor. Each of the driving transistor and the control transistor is uses a semiconductor material as a channel layer. For example, each of the driving transistor and the control transistor is formed of the same semiconductor material.

SUMMARY

An exemplary embodiment of the inventive concept provides: an organic light emitting display device comprising: an organic light emitting diode comprising an anode and a cathode; a driving transistor comprising a first semiconductor layer, wherein the driving transistor is electrically connected to the anode of the organic light emitting diode; and a control transistor comprising a second semiconductor layer including a different material from the first semiconductor layer and configured to control the driving transistor, wherein the first semiconductor layer comprises a first channel part, and first and second contact parts, the second semiconductor layer comprises a second channel part, and third and fourth contact parts, and one of the first and second contact parts directly contacts one of the third and fourth contact parts.

In an exemplary embodiment of the inventive concept, the first and second semiconductor layers are disposed on different layers from each other.

In an exemplary embodiment of the inventive concept, the organic light emitting display device further comprises an interlayer insulation layer interposed between the first and second semiconductor layers, wherein a contact hole exposing a portion of one of the third and fourth contact parts is disposed in the interlayer insulation layer and one of the first and second contact parts directly contacts one of the third and fourth contact parts via the contact hole.

In an exemplary embodiment of the inventive concept, the driving transistor comprises a first control electrode, a first input electrode connected to the first contact part, and a first output electrode connected to the second contact part, the control transistor comprises a plurality of transistors; and at least one of the plurality of transistors comprises a second control electrode, an input electrode connected to the third contact part, and an output electrode connected to the fourth contact part.

In an exemplary embodiment of the inventive concept, the first control electrode of the driving transistor overlaps the first semiconductor layer and the second control electrode of a first transistor of the plurality of transistors overlaps the second semiconductor layer.

In an exemplary embodiment of the inventive concept, the organic light emitting display device further comprises a storage capacitor connected to the driving transistor, wherein the storage capacitor comprises a first electrode and a second electrode disposed to face the first electrode, wherein the first electrode of the storage capacitor is the first control electrode of the driving transistor.

In an exemplary embodiment of the inventive concept, the second semiconductor layer is disposed on the interlayer insulation layer and the second control electrode of the first transistor of the plurality of transistors is disposed to face the second channel part of the second semiconductor layer.

In an exemplary embodiment of the inventive concept, the first semiconductor layer comprises low temperature polysilicon and the second semiconductor layer comprises an oxide semiconductor.

In an exemplary embodiment of the inventive concept, the control transistor comprises an oxide semiconductor as the second semiconductor layer.

In an exemplary embodiment of the inventive concept, the driving transistor comprises polysilicon as the first semiconductor layer and the driving transistor is a P type transistor or an N type transistor.

In an exemplary embodiment of the inventive concept, the organic light emitting display device further comprises: a data line configured to receive a data voltage; a power line configured to receive a power voltage; a scan line configured to receive a scan signal; a first light emitting line configured to receive a first light emitting control signal; a second light emitting line configured to receive a second light emitting control signal; and an initialization line configured to receive an initialization voltage.

In an exemplary embodiment of the inventive concept, the control transistor comprises second, third, fourth, fifth and sixth transistors.

In an exemplary embodiment of the inventive concept, the second transistor comprises a second control electrode connected to the scan line, a second output electrode connected to a first input electrode of the driving transistor at a first node, and a second input electrode connected to a first control electrode of the driving transistor at a third node; the third transistor comprises a third control electrode connected to the first light emitting line, a third input electrode configured to receive a power voltage, and a third output electrode connected to the first input electrode of the driving transistor at the first node; the fourth transistor comprises a fourth control electrode connected to the scan line, a fourth input electrode connected to the data line, and a fourth output electrode connected to a fourth node; the fifth transistor comprises a fifth control electrode connected to the second light emitting line, a fifth input electrode connected to the fourth node, and a fifth output electrode connected to the second node; and the sixth transistor comprises a sixth control electrode connected to the scan line, a sixth input electrode connected to the initialization line, and a sixth output electrode connected to the anode of the organic light emitting diode.

In an exemplary embodiment of the inventive concept, the organic light emitting display device further comprises a storage capacitor disposed between the third node and the fourth node.

In an exemplary embodiment of the inventive concept, the first contact part of the driving transistor directly contacts a fourth contact part of one of the second and third transistors.

In an exemplary embodiment of the inventive concept, the second contact part of the driving transistor directly contacts a fourth contact part of one of the fifth and sixth transistors.

In an exemplary embodiment of the inventive concept, a portion of the first semiconductor layer overlaps a portion of the second semiconductor layer.

An exemplary embodiment of the inventive concept provides a method of manufacturing an organic light emitting display device, the method comprising: forming a first semiconductor layer including a first channel part, and first and second contact parts on a substrate; forming an interlayer insulation layer on the first semiconductor layer; forming a first contact hole exposing a portion of one of the first and second contact parts on the interlayer insulation layer; forming a second semiconductor layer and a first control electrode on the interlayer insulation layer, wherein the second semiconductor layer comprises a second channel part, and third and fourth contact parts; forming a first insulation layer on the second semiconductor layer and the first control electrode; forming a second control electrode on the first insulation layer; forming a second insulation layer on the second control electrode; forming second and third contact holes respectively exposing portions of the first and second contact parts and forming fourth and fifth contact holes respectively exposing portions of the third and fourth contact parts; forming, on the second insulation layer, a first input electrode and a first output electrode via the second and third contact holes, respectively, wherein the first input electrode contacts the first contact part and the first output electrode contacts the second contact part; and forming a second input electrode and a second output electrode via the fourth and fifth contact holes, respectively, wherein the second input electrode is connected to the third contact part and the second output electrode is connected to the fourth contact part.

In an exemplary embodiment of the inventive concept, the first semiconductor layer comprises low temperature polysilicon and the second semiconductor layer comprises an oxide semiconductor.

In an exemplary embodiment of the inventive concept, the first to fourth contact parts include an n+ or p+ impurity.

In an exemplary embodiment of the inventive concept, the method further comprises forming a storage capacitor including a first electrode and a second electrode disposed to face the first electrode, wherein the first control electrode functions as the first electrode of the storage capacitor.

An exemplary embodiment of the inventive concept provides a display device comprising: a light emitting element comprising a first terminal and a second terminal; a first transistor comprising a first semiconductor layer, wherein the first transistor is electrically connected to the first terminal of the light emitting element; and a second transistor comprising a second semiconductor layer including a different material from the first semiconductor layer and configured to control the first transistor, wherein a first contact part of the first semiconductor layer directly contacts a second contact part of the second semiconductor layer.

In an exemplary embodiment of the inventive concept, an output terminal of the first transistor is electrically connected to an output terminal of the second transistor via the direct connection of the first and second contact parts.

In an exemplary embodiment of the inventive concept, the light emitting element is an organic light emitting diode.

BRIEF DESCRIPTION OF THE FIGURES

Exemplary embodiments of the inventive concept will be more clearly understood from the following detailed description taken in conjunction with the accompanying drawings in which:

FIGS. 8A, 8B, 8C, 8D, 8E, 8F and 8G are cross-sectional views illustrating a process for manufacturing a pixel shown in FIG. 5 according to an exemplary embodiment of the inventive concept.

DETAILED DESCRIPTION OF THE EMBODIMENTS

Figure 1:
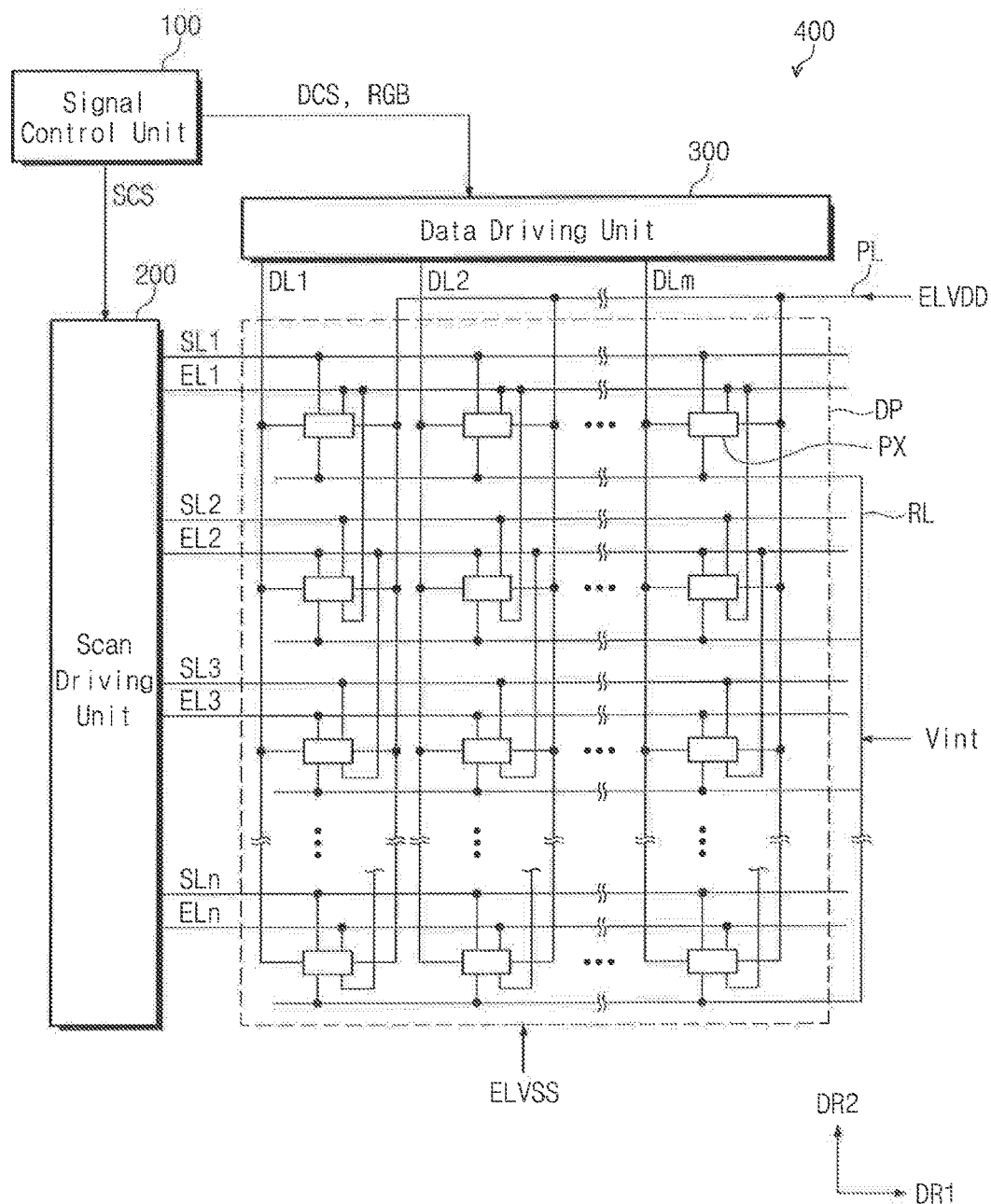
FIG. 1 is a block diagram of an organic light emitting display device according to an exemplary embodiment of the inventive concept.

Hereinafter, exemplary embodiments of the inventive concept will be described below in more detail with reference to the accompanying drawings. The inventive concept may, however, be embodied in different forms and should not be construed as limited to the embodiments set forth herein. Like reference numerals may refer to like elements throughout the specification.

FIG. 1 is a block diagram of an organic light emitting display device according to an exemplary embodiment of the inventive concept.

As shown in FIG. 1, an organic light emitting display device 400 includes a signal control unit 100, a scan driving unit 200, a data driving unit 300, and an organic light emitting display panel DP.

The signal control unit 100 receives input image signals and generates image data RGB by converting the data format of the input image signals to match the interface specifications of the data driving unit 300. The signal control unit 100 outputs the image data RGB and various control signals DCS and SCS.

The scan driving unit 200 receives the scan control signal SCS from the signal control unit 100. The scan control signal SCS (or gate control signal) may include a vertical start signal for starting an operation of the scan driving unit 200

(or gate driving circuit) and a clock signal for determining the output timings of signals output from the scan driving unit 200. The scan driving unit 200 generates a plurality of scan signals and sequentially outputs the plurality of scan signals to a plurality of scan lines SL1 to SLn which will be described later. Additionally, the scan driving unit 200 generates a plurality of light emitting control signals in response to the scan control signal SCS and outputs the plurality of light emitting control signals to a plurality of light emitting lines EL1 to ELn which will be described later.

FIG. 1 illustrates that a plurality of scan signals and a plurality of light emitting control signals are outputted from one scan driving unit 200; however, an exemplary embodiment of the inventive concept is not limited thereto. For example, the scan driving unit 200 may output only the scan signals and the organic light emitting display device 400 may further include a separate light emitting control unit for outputting the light emitting control signals.

The data driving unit 300 receives the data control signal DCS and the image data RGB from the signal control unit 100. The data driving unit 300 converts the image data RGB to data signals, and outputs the data signals to a plurality of data lines DL1 to DLm which will be described later. The data signals are analog voltages corresponding to a grayscale value(s) of the image data RGB.

The organic light emitting display panel DP may include the plurality of scan lines SL1 to SLn, the plurality of light emitting lines EL1 to ELn, the plurality of data lines DL1 to DLm, and a plurality of pixels PX. The plurality of scan lines SL1 to SLn extend in a first direction DR1 and are arranged in a second direction DR2 orthogonal to the first direction DR1. Each of the plurality of light emitting lines EL1 to ELn may be arranged parallel to a corresponding scan line among the plurality of scan lines SL1 to SLn. The plurality of data lines DL1 to DLm are insulated with and cross the plurality of scan lines SL1 to SLn.

Each of the plurality of pixels PX may be connected to a corresponding scan line among the plurality of scan lines SL1 to SLn, a corresponding light emitting line among the plurality of light emitting lines EL1 to ELn, and corresponding data lines among the plurality of data lines DL1 to DLm. Each of the plurality of pixels PX receives a power voltage ELVDD and a reference voltage ELVSS having a lower level than the power voltage ELVDD. Each of the plurality of pixels PX is connected to a power line PL where the power voltage ELVDD is applied to thereby receive the power voltage ELVDD. Each of the plurality of pixels PX is connected to an initialization line RL for receiving an initialization voltage Vint.

Each of the plurality of pixels PX may be electrically connected to two scan lines or two light emitting lines. As shown in FIG. 1, among the plurality of scan lines SL1 to SLn, pixels PX (hereinafter referred to as pixels in a second pixel row) connected to the second light emitting line EL2 may be connected to the first light emitting line EL1. The pixels PX in the second pixel row receive a second light emitting control signal applied to the second light emitting line EL2 and a first light emitting control signal applied to the first light emitting line EL1.

The organic light emitting display panel DP may further include a plurality of dummy scan lines and initialization control lines. The plurality of dummy scan lines and initialization control lines may receive a signal applied to the scan lines SL1 to SLn. Here, the dummy scan lines and the initialization control lines may be connected to each other electrically. Additionally, each of the dummy scan lines and each of the initialization control lines may be electrically connected to corresponding one of the scan lines SL1 to SLn.

Additionally, pixels (hereinafter referred to as pixels in a pixel column) connected to one data line among the plurality of data lines DL1 to DLm may be connected to each other. Adjacent two pixels among pixels in a pixel column may be electrically connected to each other.

Each of the plurality of pixels PX includes an organic light emitting diode and a circuit unit for controlling the emission of light from the organic light emitting diode. The circuit unit may include a plurality of thin film transistors (hereinafter referred to as transistors) and capacitors. The plurality of pixels PX may include red pixels for emitting a red color, green pixels for emitting a green color, and blue pixels for emitting a blue color. An organic light emitting diode of the red pixel, an organic light emitting diode of the green pixel, and an organic light emitting diode of the blue pixel may include organic light emitting layers of different materials.

The plurality of scan lines SL1 to SLn, the plurality of light emitting lines EL1 to ELn, the plurality of data lines DL1 to DLm, the power line PL, the initialization line RL, and the plurality of pixels PX may be formed on a base substrate through a photolithography process. Through a deposition process or a coating process, a plurality of insulation layers may be formed on the base substrate. The insulation layers may include an organic layer and/or an inorganic layer. In addition, a sealing layer for protecting the plurality of pixels PX may be further formed on the base substrate.

Figure 2:
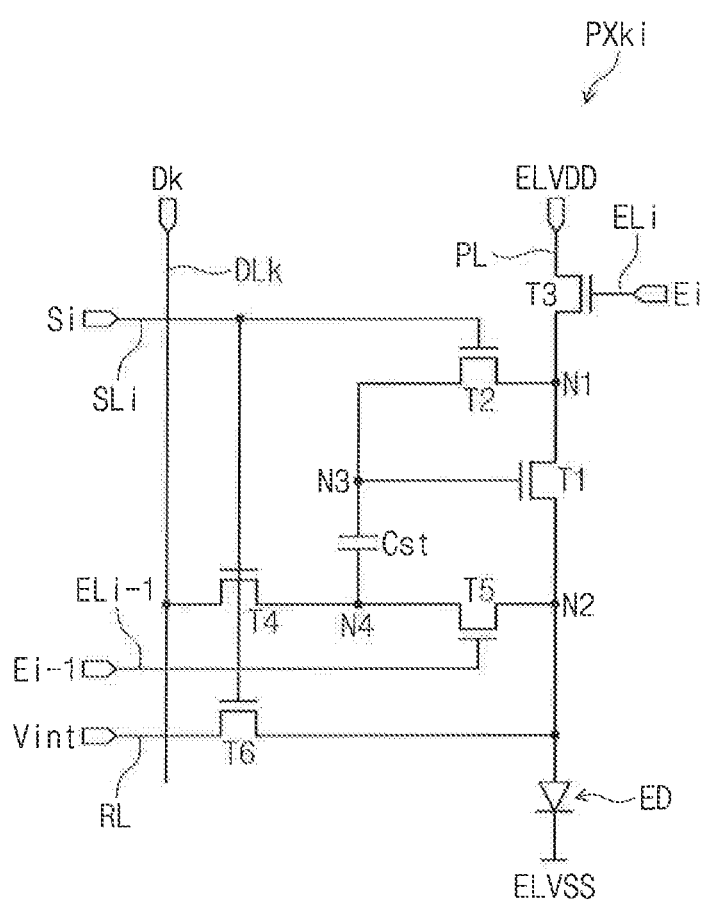
FIG. 2 is a circuit diagram of pixels according to an exemplary embodiment of the inventive concept.

FIG. 2 is a circuit diagram of pixels according to an exemplary embodiment of the inventive concept.

FIG. 2 shows a (k×i)th pixel PXki connected to a k-th data line DLk among the plurality of data lines DL1 to DLm and an i-th scan line SLi among the plurality of scan lines SL1 to SLn.

The (k×i)th pixel PXki includes an organic light emitting diode ED and a circuit unit for controlling the organic light emitting diode ED. In an exemplary embodiment of the inventive concept, the circuit unit may include first to sixth transistors T1 to T6 and a capacitor Cst. Hereinafter, the first to sixth transistors T1 to T6 are described as N-type thin film transistors. However, the circuit unit shown in FIG. 2 is just an example and its configuration may be modified and implemented.

The first transistor T1 among the first to sixth transistors T1 to T6 is a driving transistor for controlling a driving current supplied to the organic light emitting diode ED and the second to sixth transistors T2 to T6 are transistors for controlling the first transistor T1. Here, the control transistors may include a plurality of transistors. Although it is described that the control transistors include the second to sixth transistors T2 to T6, the inventive concept is not limited thereto. For example, the control transistors may include transistors of less than or greater than five. Additionally, a connection structure of the second to sixth transistors T2 to T6 is not limited thereto.

The control transistors may receive a plurality of pixel control signals. The pixel control signals applied to the (k×i)th pixel PXki may include an i-th scan signal Si, a k-th data signal Dk, an i-th light emitting control signal Ei, and an (i−1)th light emitting control signal Ei−1.

The first transistor T1 includes a first control electrode, a first input electrode, and a first output electrode. The first input electrode receives the power voltage ELVDD from the third transistor T3. The first output electrode is connected to the anode of the organic light emitting diode ED and provides the power voltage ELVDD to the anode. The cathode of the organic light emitting diode ED receives the reference voltage ELVSS.

Herein, a node where the first input electrode is connected to the third transistor T3 is a first node N1, and a node where the first output electrode is connected to the anode of the organic light emitting diode ED is a second node N2. The first control electrode is connected to a third node N3. The first transistor T1 controls a driving current supplied to the organic light emitting diode ED in correspondence with the potential of the third node N3.

The second transistor T2 includes a second control electrode, a second input electrode, and a second output electrode. The second control electrode is connected to the i-th scan line SLi to receive the i-th scan signal Si; the second input electrode is connected to the third node N3; and the second output electrode is connected to the first node N1. When the second transistor T2 is turned on by the i-th scan signal Si, the first node N1 and the third node N3 are electrically conductive to each other by the second transistor T2, so that the first transistor T1 may be connected in a diode form.

The third transistor T3 includes a third control electrode, a third input electrode, and a third output electrode. The third control electrode is connected to the i-th light emitting line ELi to receive the i-th light emitting control signal Ei; the third input electrode is connected to the power line PL to receive the power voltage ELVDD; and the third output electrode is connected to the first node N1. The third transistor T3 is switched by the i-th light emitting control signal Ei to supply the power voltage ELVDD to the first node N1 or cut off the power voltage ELVDD.

The fourth transistor T4 includes a fourth control electrode, a fourth input electrode, and a fourth output electrode. The fourth control electrode is connected to the i-th scan line SLi to receive the i-th scan signal Si; the fourth input electrode is connected to the k-th data line DLk to receive the k-th data signal Dk; and the fourth output electrode is connected to a fourth node N4.

A storage capacitor Cst is formed between the third node N3 and the fourth node N4. The fourth transistor T4 is turned on by the i-th scan signal Si, so that it provides the k-th data signal Dk to the storage capacitor Cst. Accordingly, a charging voltage varies in the storage capacitor Cst in response to the k-th data signal Dk.

The fifth transistor T5 includes a fifth control electrode, a fifth input electrode, and a fifth output electrode. The fifth control electrode is connected to the (i−1)th light emitting line ELi−1 to receive the (i−1)th light emitting control signal Ei−1; the fifth input electrode is connected to the fourth node N4; and the fifth output electrode is connected to the second node N2. The fifth transistor T5 is switched by the (i−1)th light emitting control signal Ei−1 so that it controls an electrical conduction of the fourth node N4 and the second node N2.

The sixth transistor T6 includes a sixth control electrode, a sixth input electrode, and a sixth output electrode. The sixth control electrode is connected to the i-th scan line SLi to receive the i-th scan signal Si; the sixth input electrode is connected to the initialization line RL to receive the initialization voltage Vint; and the sixth output electrode is connected to the anode electrode of the organic light emitting diode ED. When the sixth transistor T6 is turned on by the i-th scan signal Si, the initialization voltage Vint is applied to the anode electrode of the organic light emitting diode ED.

Figure 3:
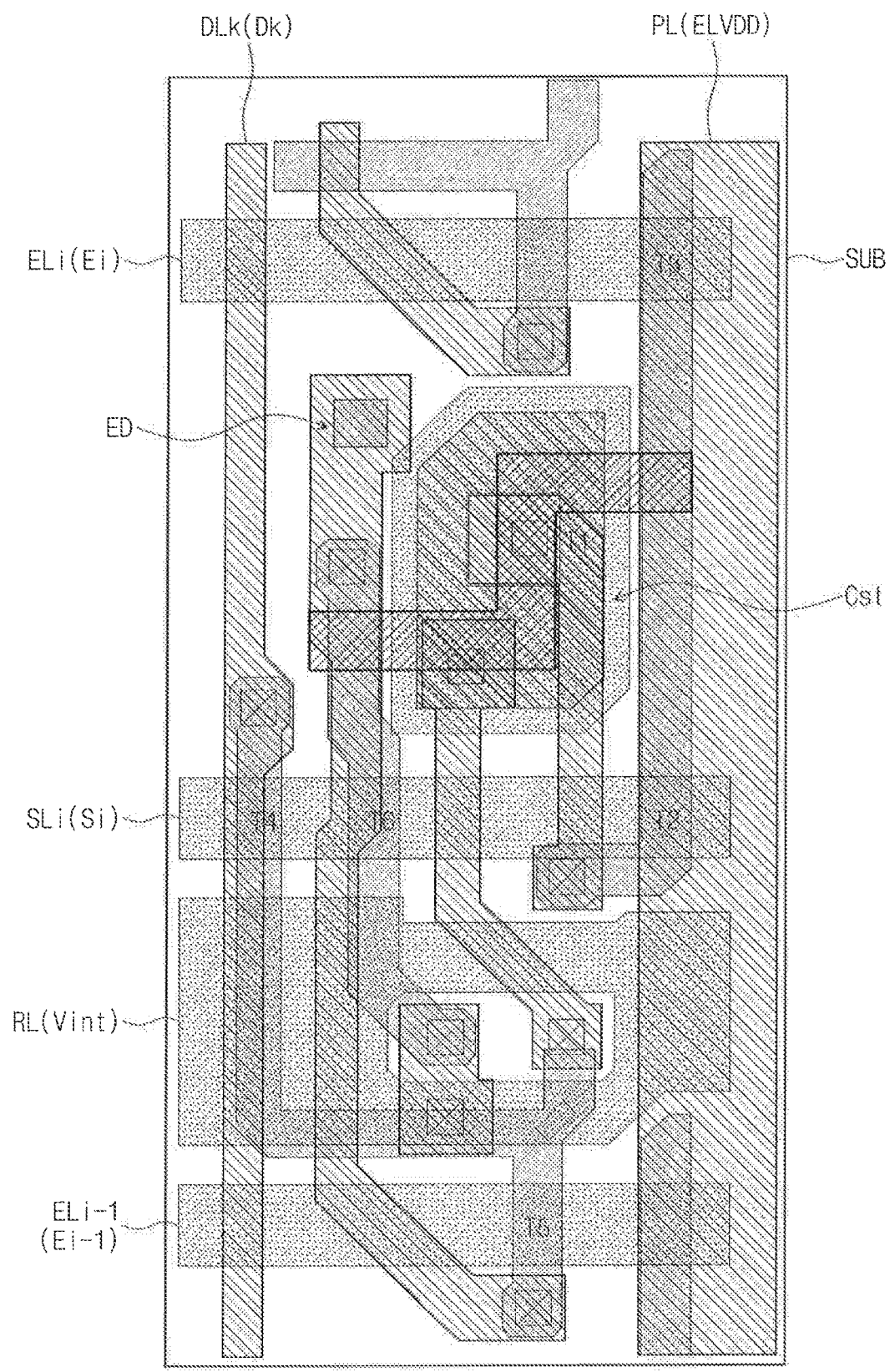
FIG. 3 is a plan view illustrating the layout of a pixel shown in FIG. 2 according to an exemplary embodiment of the inventive concept.

FIG. 3 is a plan view illustrating a layout of the (k×i)th pixel shown in FIG. 2 according to an exemplary embodiment of the inventive concept. FIGS. 4A, 4B, 4C and 4D are plan views illustrating a manufacturing order of the (k×i)th pixel shown in FIG. 3 according to an exemplary embodiment of the inventive concept. FIG. 5 is a partial cross-sectional view of FIG. 3 according to an exemplary embodiment of the inventive concept.

Referring to FIG. 3, the organic light emitting diode ED of the (k×i)th pixel PXki, the first to sixth transistors T1 to T6, and the storage capacitor Cst are disposed on a base substrate SUB. Additionally, the i-th scan line SLi, the i-th light emitting line ELi, the (i−1)th light emitting line ELi−1, the k-th data line DLk, the power line PL, and the initialization line RL are disposed on the base substrate SUB.

Figure 4A:
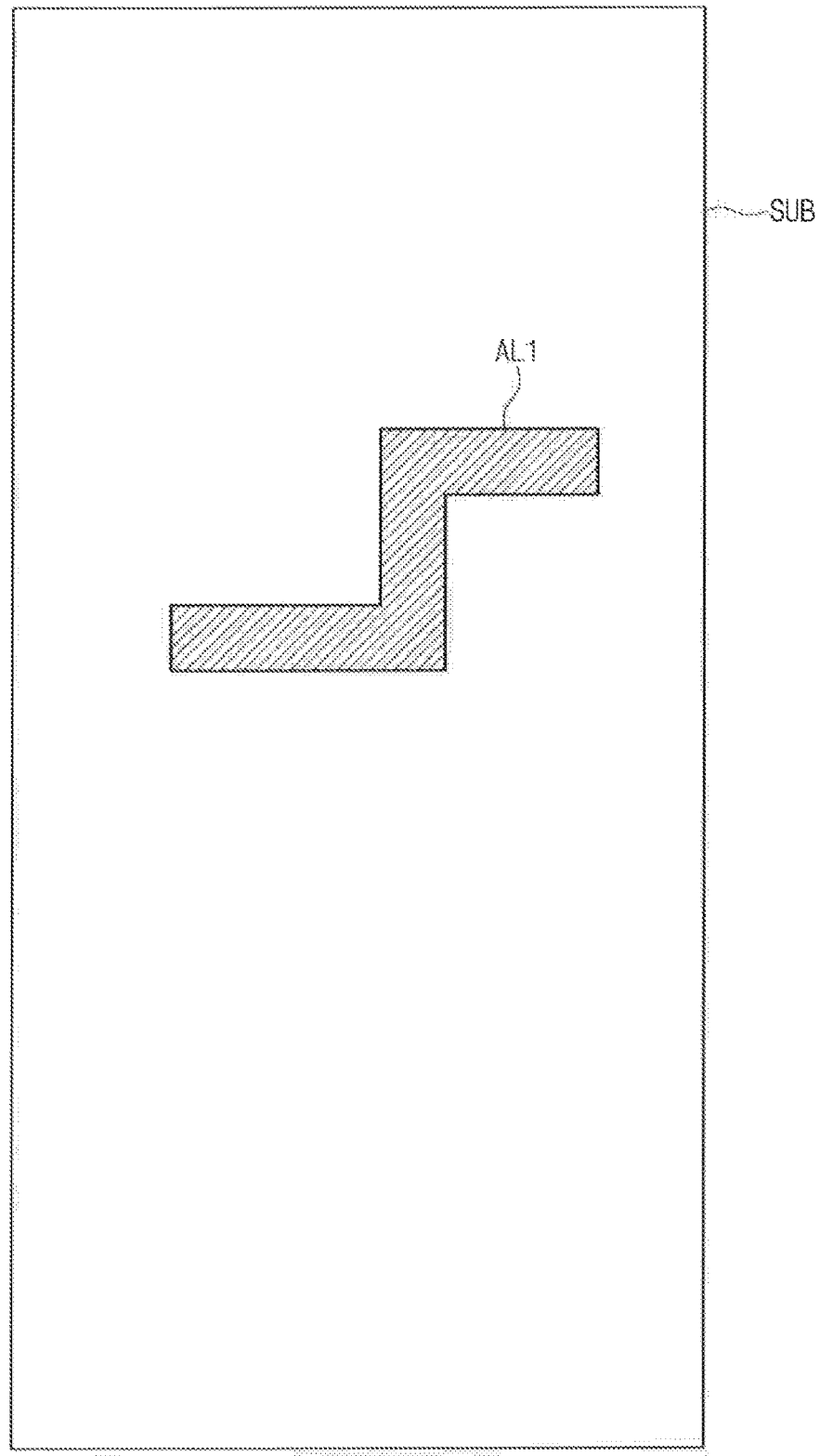
FIGS. 4A, 4B, 4C and 4D are plan views illustrating a manufacturing order of a (k×i)th pixel shown in FIG. 3 according to an exemplary embodiment of the inventive concept.
Figure 5:
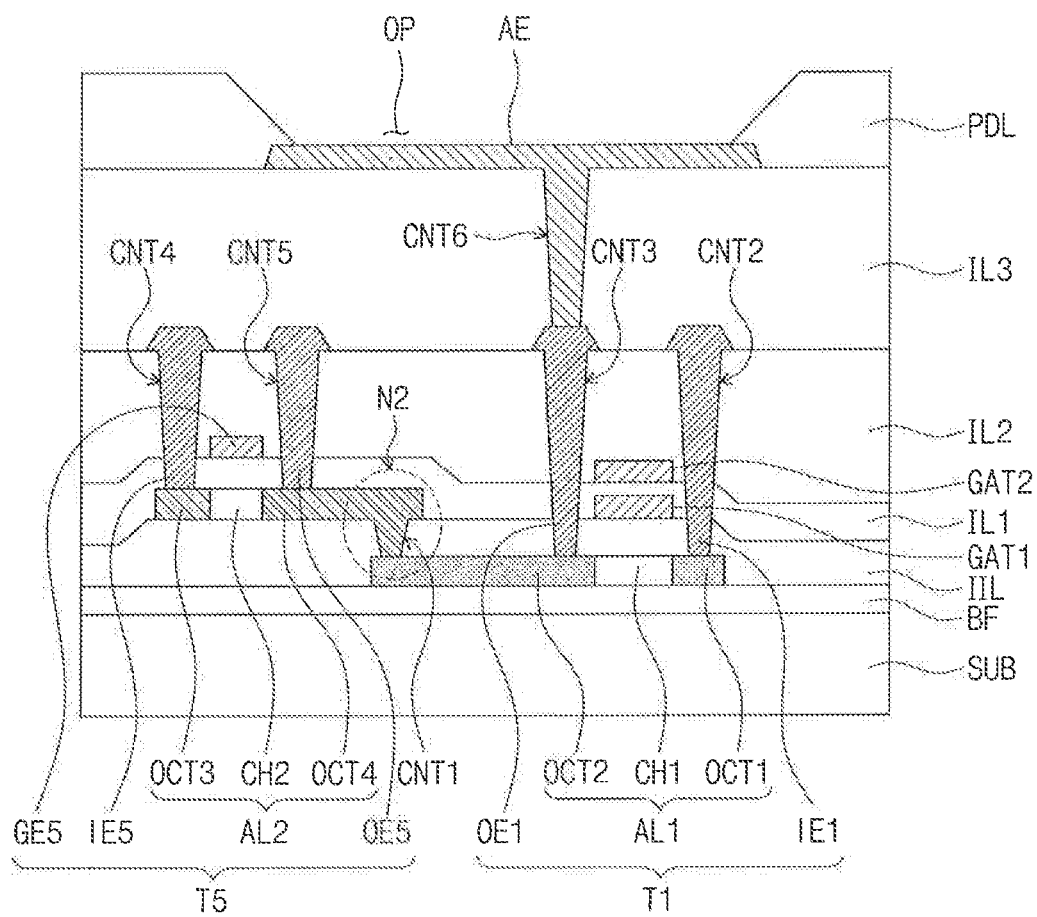
FIG. 5 is a partial cross-sectional view of FIG. 3 according to an exemplary embodiment of the inventive concept.

Referring to FIGS. 3, 4A, and 5, a buffer layer BF is formed on the base substrate SUB and a first semiconductor layer AL1 is formed on the buffer layer BF. The buffer layer BF may include any one of an inorganic insulation material and/or an organic insulation material. The inorganic insulation matter may include an inorganic insulation material such as SiOx, SiNx, SiON, and SiOF. The buffer layer BF may be a single layer or multiple layer including at least one of the aforementioned materials.

The first semiconductor layer AL1 includes a first channel part CH1, and first and second contact parts OCT1 and OCT2. The first channel part CH1 is a channel area of the first transistor T1. The first semiconductor layer AL1 may include low-temperature polysilicon (LTPS). The first and second contact parts OCT1 and OCT2 may be areas including an impurity. The first and second contact parts OCT1 and OCT2 may be areas doped by injecting an n+ or p+ dopant. The impurity injected to the first and second contact parts OCT1 and OCT2 may vary according to a type of the first transistor T1. The first transistor T1 may be an N type transistor but the inventive concept is not limited thereto. In the case when the first transistor T1 is the N type transistor, the first and second contact parts OCT1 and OCT2 may be an area doped with the n+ dopant. The first channel part CH1 is formed between the first and second contact parts OCT1 and OCT2.

The first semiconductor layer AL1 is covered by an interlayer insulation layer IIL. The interlayer insulation layer IIL may include an inorganic insulation material such as SiOx, SiNx, SiON, and SiOF or an organic insulation material, and may be a single layer or multiple layers including at least one of these materials. A first contact hole CNT1 for exposing the second contact part OCT2 is formed in the interlayer insulation layer IIL.

Figure 4B:
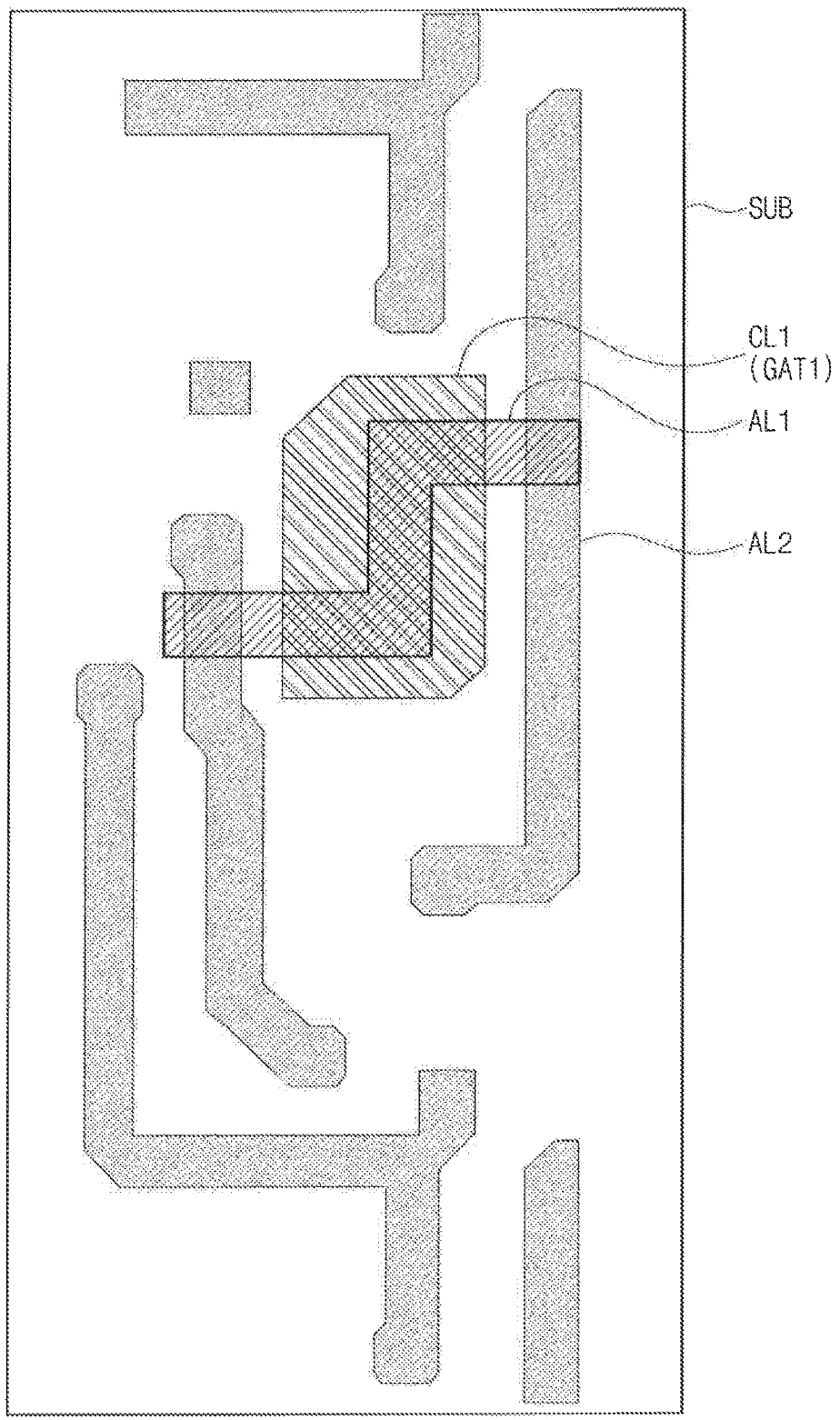

Referring to FIGS. 3, 4B, and 5, a second semiconductor layer AL2 and a first conductive layer CL1 are formed on the interlayer insulation layer IIL. The second semiconductor layer AL2 forms a channel area of the second to sixth transistors T2 to T6. The second semiconductor layer AL2 includes an oxide semiconductor. For example, the oxide semiconductor may include a metal oxide of Zn, In, Ga, Sn, and Ti or a compound of a metal of Zn, In, Ga, Sn, and Ti and an oxide thereof.

Only at least one of the second to sixth transistors T2 to T6 may include the second semiconductor layer AL2. In other words, although it is shown in FIG. 3 that all of the second to sixth transistors T2 to T6 use an oxide semiconductor as a semiconductor layer, the inventive concept is not limited thereto. For example, at least one transistor among the second to sixth transistors T2 to T6 may include an oxide semiconductor.

In an area where each of the second to sixth transistors T2 to T6 is formed, the second semiconductor layer AL2 may include a second channel part CH2, and third and fourth contact parts OCT3 and OCT4.

The third and fourth contact parts OCT3 and OCT4 of the second semiconductor layer AL2 may be an area processed with hydrogen plasma. In FIG. 3, although it is shown that all of the second to sixth transistors T2 to T6 are N-type transistors, the inventive concept is not limited thereto.

As shown in FIG. 5, the second channel part CH2 is formed between the third and fourth contact parts OCT3 and OCT4. At least one of the third and fourth contact parts OCT3 and OCT4 may directly contact one of the first and second contact parts OCT1 and OCT2. For example, the fourth contact part OCT4 directly contacts the second contact part OCT2. More particularly, when a portion of the second contact part OCT2 is exposed by the first contact hole CNT1 of the interlayer insulation layer IIL, at least one of the third and fourth contact parts OCT3 and OCT4 may directly contact the second contact part OCT2 via the first contact hole CNT1. When the fourth contact part OCT4 directly contacts the second contact part OCT2, the fourth contact part OCT4 may be disposed to overlap the second contact part OCT2 in a portion of the contact hole CNT1. In other words, a portion of the first semiconductor layer AL1 and a portion of the second semiconductor layer AL2 may overlap each other.

Moreover, the first conductive layer CL1 includes the first control electrode GAT1 of the first transistor T1. The first control electrode GAT1 may be disposed to face the first channel part CH1 of the first semiconductor layer AL1. The first control electrode GAT1 may be a first electrode of the storage capacitor Cst.

Figure 4C:
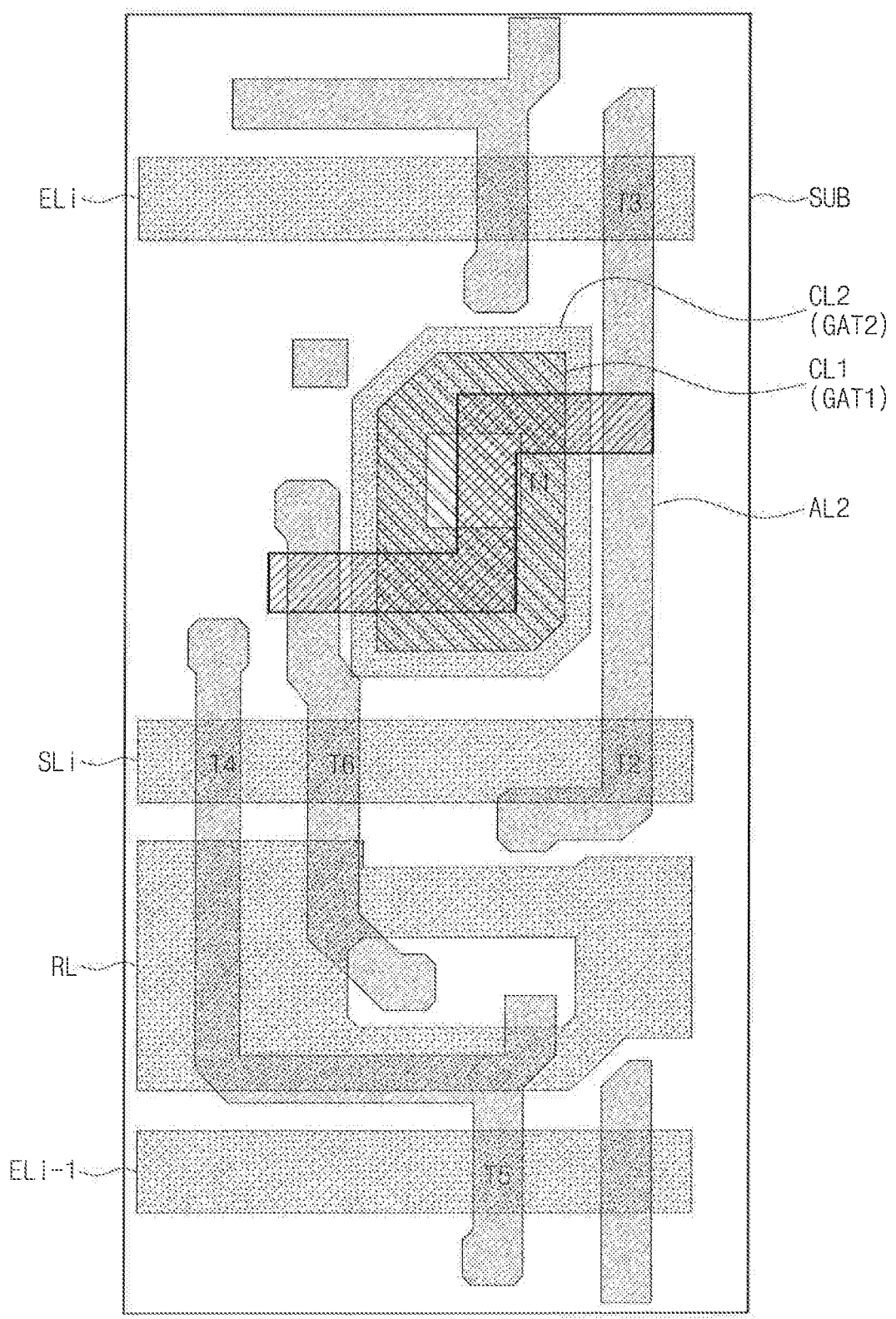

Referring to FIGS. 3, 4C, and 5, the first control electrode GAT1 and the second semiconductor layer AL2 are covered by a first insulation layer IL1. The first insulation layer IL1 may include an inorganic insulation material such as SiOx, SiNx, SiON, and SiOF or an organic insulation material, and may be a single layer or multiple layers including at least one of these materials. A second conductive layer CL2 is formed on the first insulation layer IL1. The second conductive layer CL2 may include the respective second to sixth control electrodes of the second to sixth transistors T2 to T6 and the second electrode GAT2 of the storage capacitor Cst. Each of the second to sixth control electrodes (see e.g., GE5 in FIG. 5) is disposed at a corresponding upper part of the second channel part CH2 of the second semiconductor layer AL2. Additionally, the second electrode GAT2 of the storage capacitor Cst is disposed to face the first control electrode GAT1 with the first insulation layer IL1 therebetween.

The second conductive layer CL2 may further include the i-th scan line SLi, the i-th light emitting line ELi, the (i−1)th light emitting line ELi−1, and the initialization line RL.

A portion of the i-th scan line SLi functions as the second control electrode of the second transistor T2, the fourth control electrode of the fourth transistor T4, and the sixth control electrode of the sixth transistor T6. Additionally, the i-th light emitting line ELi functions as the third control electrode of the third transistor T3, and the (i−1)th light emitting line ELi−1 functions as the fifth control electrode of the fifth transistor T5.

The second conductive layer CL2 is covered by a second insulation layer IL2. The second insulation layer IL2 may include at least one of an inorganic insulation material and/or an organic insulation material.

As shown in FIG. 5, second and third contract holes CNT2 and CNT3 penetrating the interlayer insulation layer IIL and the first and second insulation layers IL1 and IL2 to expose the first and second contact parts OCT1 and OCT2 are formed in the interlayer insulation layer IIL and the first and second insulation layers IL1 and IL2. Fourth and fifth contract holes CNT4 and CNT5 penetrating the first and second insulation layers IL1 and IL2 to expose the third and fourth contact parts OCT3 and OCT4 are formed in the first and second insulation layers IL1 and IL2.

Figure 4D:
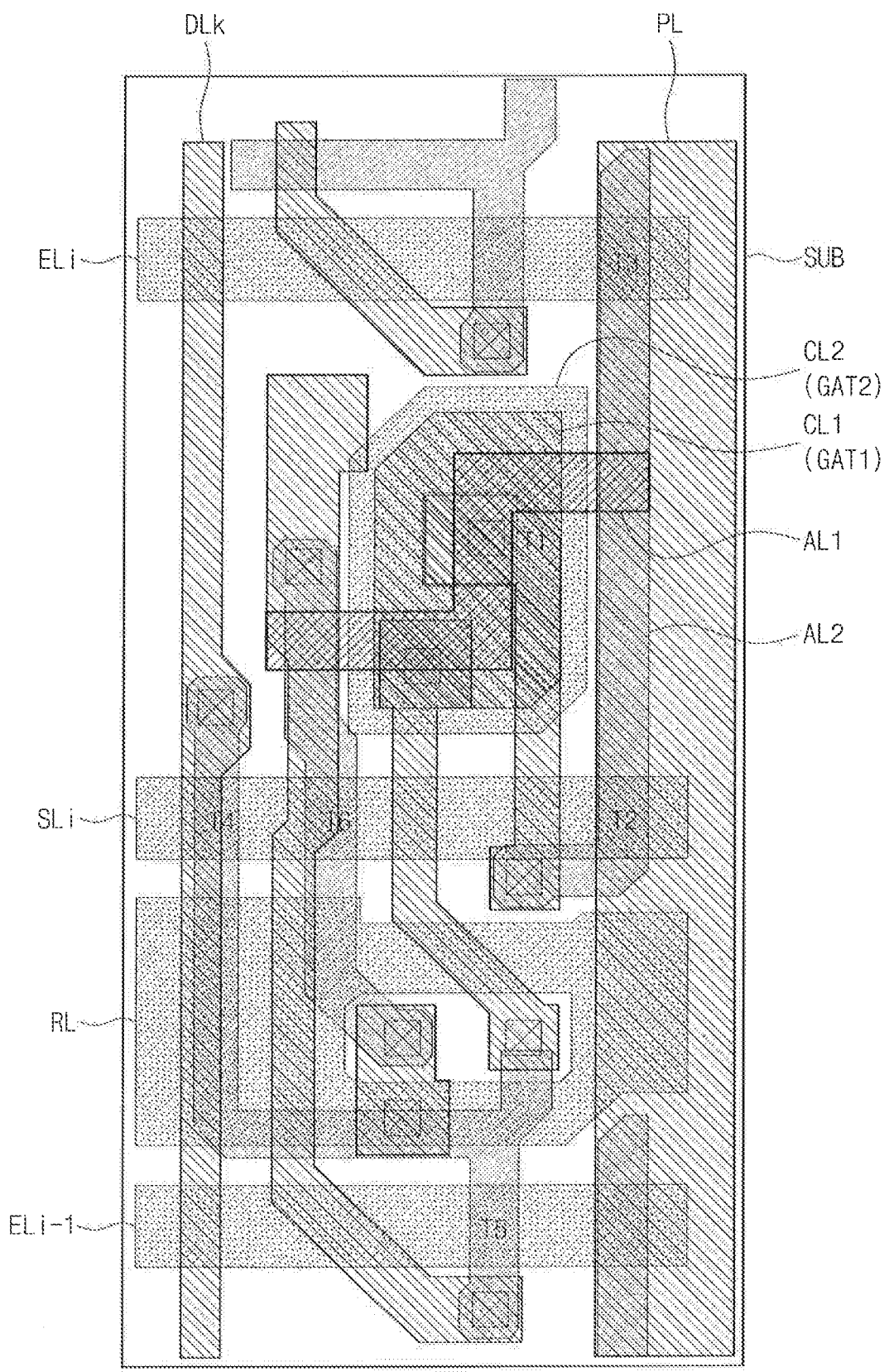

Referring to FIGS. 3, 4D, and 5, a third conductive layer is formed on the second insulation layer IL2. The third conductive layer includes the first input electrode IE1 and the first output electrode OE1 of the first transistor T1. The first input electrode IE1 contacts the first contact part OCT1 via the second contact hole CNT2 and the first output electrode OE1 contacts the second contact part OCT2 via the third contact hole CNT3.

The third conductive layer includes the second to sixth input electrodes and the second to sixth output electrodes of the second to sixth transistor T2 to T6. Additionally, the third conductive layer may further include the k-th data line DLk and the power line PL.

As shown in FIG. 2, the second and third transistors T2 and T3 among the second to sixth transistors T2 to T6 are connected to the first node N1 connected to the first input electrode IE1 of the first transistor T1. Additionally, the fifth and sixth transistors T5 and T6 among the second to sixth transistors T2 to T6 are connected to the second node N2 connected to the first output electrode OE1 of the first transistor T1.

At the first node N1, the first input electrode IE1 of the first transistor T1 is electrically connected to the output electrode (or input electrode) of at least one of the second and third transistors T2 and T3. At this point, the first contact part OCT1 of the first transistor T1 may directly contact one of the third and fourth contact parts OCT3 and OCT4 in the second semiconductor layer AL2 of one of the second and third transistors T2 and T3. Accordingly, to connect the first input electrode TE1 of the first transistor T1 and the output electrode (or input electrode) of at least one of the second and third transistors T2 and T3, a path for connecting the first contact part OCT1 to the third or fourth contact part OCT3 or OCT4 may be formed.

This way, different types of transistors that are to be electrically connected to each other, may be electrically connected by directly contacting contact parts of the first and second semiconductor layers AL1 and AL2 with each other. Accordingly, a separate bridge electrode for connecting transistors to each other may be omitted. Additionally, by employing a direct contact structure that utilizes a contact part of a semiconductor layer as per the inventive concept, it is possible to increase the size of a pixel design space (or better utilize the pixel design space), and as a result, it is possible to increase a design margin or an aperture ratio.

Moreover, as shown in FIG. 5 (also refer to FIG. 2), at the second node N2, the fifth output electrode OE5 of the fifth transistor T5 is connected to the first output electrode OE1 of the first transistor T1. Here, the second contact part OCT2 of the first transistor T1 may directly contact the fourth contact part OCT4 in the second semiconductor layer AL2 of the fifth transistor T5. Accordingly, to connect the first output electrode OE1 of the first transistor T1 and the fifth output electrode OE5 of the fifth transistor T5 to each other, a path for connecting the second contact part OCT2 to the fourth contact part OCT4 may be formed.

This way, in a structure for electrically connecting an oxide semiconductor transistor (for example, the fifth transistor T5) and an LTPS transistor (for example, the first transistor T1), contact parts of the first and second semiconductor layers AL1 and AL2 may be directly contacted. Accordingly, a separate bridge electrode for connecting these transistors to each other may be omitted. Additionally, by employing a direct contact structure that utilizes a contact part of each semiconductor layer as per the inventive concept, it is possible to increase the utilization of a pixel design space. For example, through better space utilization, more components can be provided in a pixel design space. In other words, more space may be available for components in the organic light emitting display device.

Referring to FIG. 5 again, a third insulation layer IL3 may be disposed on the third conductive layer. The third insulation layer IL3 may include at least one of an inorganic insulation material and/or an organic insulation material. The third insulation layer IL3 may be formed of an organic insulation material to provide a flat surface.

A sixth contact hole CNT6 for exposing a portion of the first output electrode OE1 of the first transistor T1 is formed in the third insulation layer IL3. An anode AE of the organic light emitting diode ED (refer to FIG. 2) is formed on the third insulation layer IL3.

A pixel definition layer PDL is disposed on the third insulation layer IL3 where the anode AE is formed. An opening part OP for exposing the anode AE is provided in the pixel definition layer PDL. An organic light emitting layer overlapping the opening part OP is disposed on the anode AE. A cathode is disposed on the organic light emitting layer.

In addition, a sealing layer for covering the organic light emitting diode ED may be disposed on the cathode. The sealing layer may include a plurality of organic layers and/or inorganic layers. The inorganic layer may include an inorganic insulation material such as SiOx, SiNx, SiON, and SiOF, and may be a single layer or multiple layers including at least one of these materials.

In FIGS. 3 to 5, although it is shown that each of the first to sixth transistors T1 to T6 has a top-gate structure, the inventive concept is not limited thereto. In other words, when each of the first to sixth transistors T1 to T6 has a bottom gate structure, if different types of transistors are to be electrically connected to each other, a structure for directly contacting contact parts of the first and second semiconductor layers AL1 and AL2 may be employed.

Figure 6:
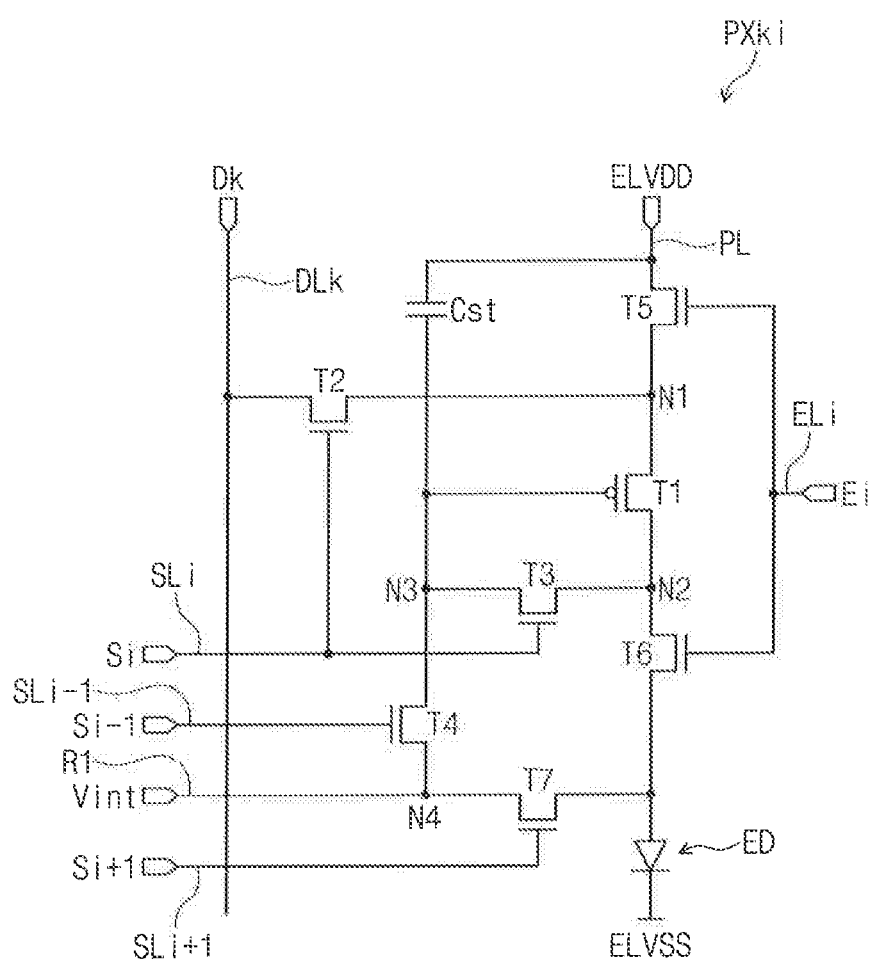
FIG. 6 is a circuit diagram of pixels according to an exemplary embodiment of the inventive concept.

FIG. 6 is a circuit diagram of pixels according to an exemplary embodiment of the inventive concept.

FIG. 6 shows the (k×i)th pixel PXki connected to the k-th data line DLk among the plurality of data lines DL1 to DLm and the i-th scan line SLi among the plurality of scan lines SL1 to SLn.

The (k×i)th pixel PXki includes an organic light emitting diode ED and a circuit unit for controlling the organic light emitting diode ED. In an exemplary embodiment of the inventive concept, the circuit unit may include first to seventh transistors T1 to T7 and a storage capacitor Cst. Hereinafter, it is described that the first transistor T1 is a P-type LTPS transistor and the second to seventh transistors T2 to T7 are N-type oxide semiconductor transistors. The circuit unit shown in FIG. 6 is just an example and its configuration may be modified and implemented.

The first transistor T1 among the first to seventh transistors T1 to T7 is a driving transistor for controlling a driving current supplied to the organic light emitting diode ED and the second to seventh transistors T2 to T7 are transistors for controlling the first transistor T1. In other words, the control transistors may include a plurality of transistors. According to an exemplary embodiment of the inventive concept, although it is described that the control transistors include the second to seventh transistors T2 to T7, the inventive concept is not limited thereto. For example, the control transistors may include more than six transistors.

The control electrodes of the control transistors may receive a control signal. For example, a control signal applied to the (k×i)th pixel PXki may include the (i−1)th scan signal Si−1, the i-th scan signal Si, the k-th data signal Dk, and the i-th light emitting control signal Ei.

The first transistor T1 includes a first control electrode, a first input electrode, and a first output electrode. The first input electrode receives the power voltage ELVDD from the fifth transistor T5. The first output electrode is connected to the anode of the organic light emitting diode ED via the sixth transistor T6.

Herein, a node where the first input electrode is connected to the fifth transistor T5 is a first node N1, and a node where the first output electrode is connected to the sixth transistor T6 is a second node N2. The first control electrode is connected to a third node N3. The first transistor T1 controls a driving current supplied to the organic light emitting diode ED in correspondence with the potential of the third node N3.

The second transistor T2 includes a second control electrode, a second input electrode, and a second output electrode. The second control electrode is connected to the i-th scan line SLi to receive the i-th scan signal Si; the second input electrode is connected to the k-th data line DLk to receive the k-th data signal Dk; and the second output electrode is connected to the first node N1. When the second transistor T2 is turned on by the i-th scan signal Si, the k-th data signal Dk is inputted to the first node N1.

The third transistor T3 includes a third control electrode, a third input electrode, and a third output electrode. The third control electrode is connected to the i-th scan line SLi to receive the i-th scan signal Si; the third input electrode is connected to the third node N3; and the third output electrode is connected to the second node N2. The third node N3 and the second node N2 are electrically conductive to each other by the third transistor T3, so that the first transistor T1 may be connected in a diode form.

The fourth transistor T4 includes a fourth control electrode, a fourth input electrode, and a fourth output electrode. The fourth control electrode is connected to the (i−1)th scan line SLi−1 to receive the (i−1)th scan signal Si−1; the fourth input electrode is connected to the initialization line RL to receive the initialization voltage Vint; and the fourth output electrode is connected to the third node N3. Accordingly, the fourth transistor T4 is turned on by the (i−1)th scan signal Si−1, so that it provides the initialization voltage Vint to the third node N3.

The fifth transistor T5 includes a fifth control electrode, a fifth input electrode, and a fifth output electrode and the sixth transistor T6 includes a sixth control electrode, a sixth input electrode, and a sixth output electrode. The fifth and sixth control electrodes are connected to the i-th light emitting line ELi to receive the i-th light emitting control signal Ei; the fifth input electrode is connected to the power line PL to receive the power voltage ELVDD; and the fifth output electrode is connected to the first node N1. The sixth input electrode is connected to the second node N2 and the sixth output electrode is connected to the anode of the organic light emitting diode ED.

The fifth and sixth transistors T5 and T6 are switched by the i-th light emitting control signal Ei to supply the power voltage ELVDD to the first node N1 and the anode or cut off the power voltage ELVDD.

According to operations of the fifth transistor T5 and the sixth transistor T6, a current path may be formed or blocked between the power line PL and the organic light emitting diode ED. According to an exemplary embodiment of the inventive concept, one of the fifth transistor T5 and the sixth transistor T6 may be omitted.

A storage capacitor Cst is formed between the third node N3 and the power line PL. The storage capacitor Cst charges a voltage corresponding to a voltage applied to the third node N3.

The seventh transistor T7 includes a seventh control electrode, a seventh input electrode, and a seventh output electrode. The seventh control electrode is connected to the (i+1)th scan line SLi+1 to receive the (i+1)th scan signal Si+1; the seventh input electrode is connected to the initialization line RL to receive the initialization voltage Vint; and the seventh output electrode is connected to the anode of the organic light emitting diode ED. When the seventh transistor T7 is turned on, the anode of the organic light emitting diode ED is initialized by the initialization voltage Vint. A potential difference between the initialization voltage Vint and the reference voltage ELVSS applied to the cathode of the organic light emitting diode ED may be less than a light emitting threshold voltage of the organic light emitting diode ED.

Figure 7:
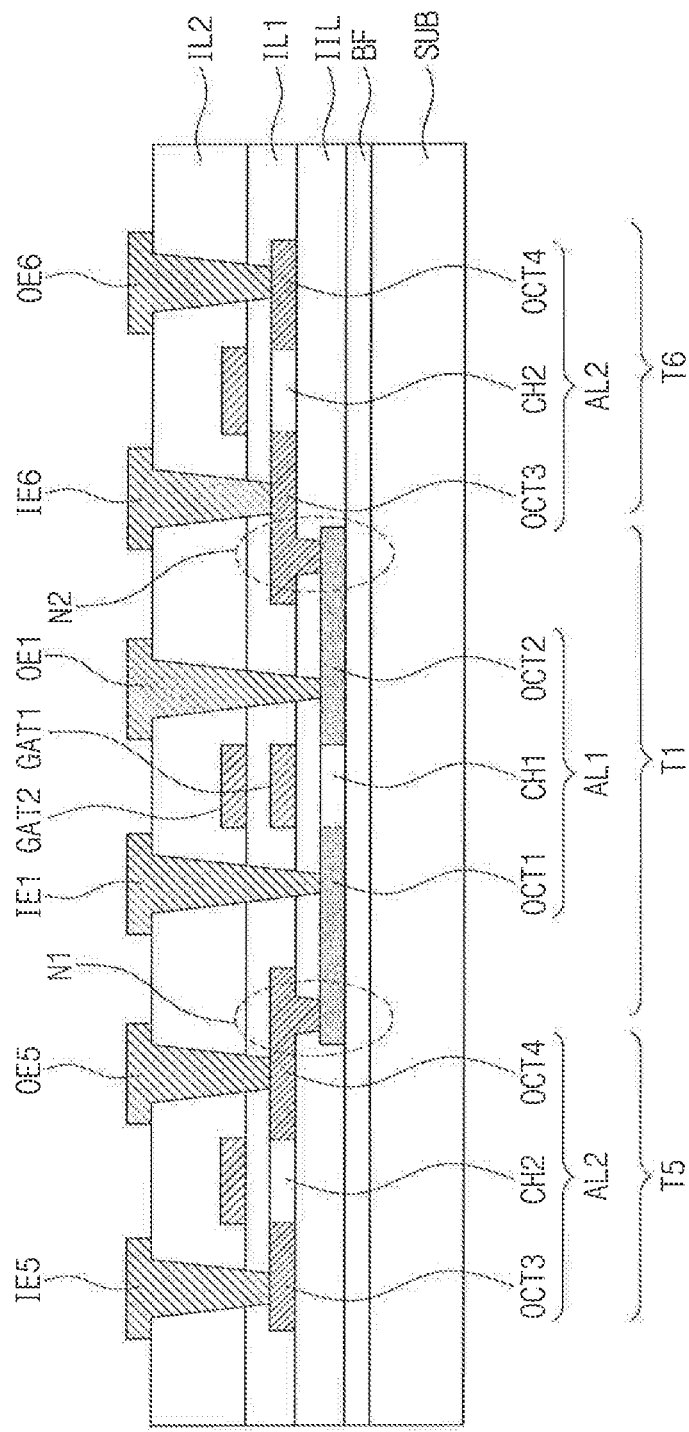
FIG. 7 is a partial cross-sectional view of FIG. 6 according to an exemplary embodiment of the inventive concept.

FIG. 7 is a cross-sectional view of FIG. 6 according to an exemplary embodiment of the inventive concept.

Referring to FIGS. 6 and 7, the second and fifth transistors T2 and T5 among the second to seventh transistors T2 to T7 are connected to the first node N1 which is connected to the first input electrode IE1 of the first transistor T1. Additionally, the third and sixth transistors T3 and T6 among the second to seventh transistors T2 to T7 are connected to the second node N2 which is connected to the first output electrode OE1 of the first transistor T1.

At the first node N1, the first input electrode IE1 of the first transistor T1 is electrically connected to the output electrode (or input electrode) of at least one of the second and fifth transistors T2 and T5. At this point, the first contact part OCT1 of the first transistor T1 may directly contact one of the third and fourth contact parts OCT3 and OCT4 in the second semiconductor layer AL2 of one of the second and fifth transistors T2 and T5.

As shown in FIG. 7, at the first node N1, the fifth output electrode OE5 of the fifth transistor T5 is connected to the first input electrode IE1 of the first transistor T1. Here, the first contact part OCT1 of the first transistor T1 may directly contact the fourth contact part OCT4 in the second semiconductor layer AL2 of the fifth transistor T5. Accordingly, to connect the first input electrode IE1 of the first transistor T1 and the fifth output electrode OE5 of the fifth transistor T5, a path for connecting the second contact part OCT2 to the fourth contact part OCT4 may be formed.

Additionally, at the second node N2, the first output electrode OE1 of the first transistor T1 is electrically connected to the output electrode (or input electrode) of at least one of the third and sixth transistors T3 and T6. At this point, the second contact part OCT2 of the first transistor T1 may directly contact one of the third and fourth contact parts OCT3 and OCT4 in the second semiconductor layer AL2 of one of the third and sixth transistors T3 and T6.

As shown in FIG. 7, at the second node N2, the sixth input electrode IE6 of the sixth transistor T6 is connected to the first output electrode OE1 of the first transistor T1. Here, the second contact part OCT2 of the first transistor T1 may directly contact the third contact part OCT3 in the second semiconductor layer AL2 of the sixth transistor T6. Accordingly, to connect the first output electrode OE1 of the first transistor T1 and the sixth input electrode IE6 of the sixth transistor T6, a path for connecting the second contact part OCT2 to the third contact part OCT3 may be formed.

This way, in a structure for electrically connecting an oxide semiconductor transistor (for example, the fifth and sixth transistors T5 and T6) and an LTPS transistor (for example, the first transistor T1), contact parts of the first and second semiconductor layers AL1 and AL2 may be directly contacted. Accordingly, a separate bridge electrode for connecting these transistors to each other may be omitted. Additionally, by employing a direct contact structure that utilizes a contact part of each semiconductor layer as per the inventive concept, it is possible to increase the utilization of a pixel design space.

FIGS. 8A, 8B, 8C, 8D, 8E, 8F and 8G are cross-sectional views illustrating a process for manufacturing a pixel shown in FIG. 5 according to an exemplary embodiment of the inventive concept.

Figure 8A:
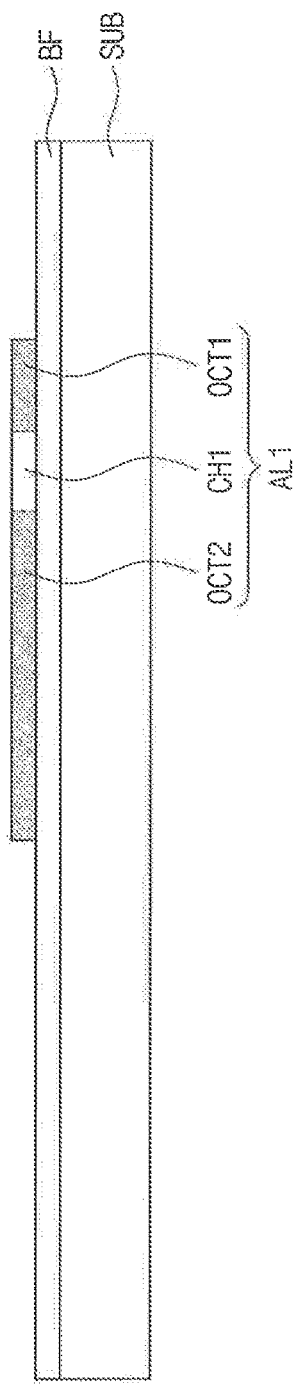

Referring to FIG. 8A, a buffer layer BF is formed on the base substrate SUB and a first semiconductor layer AL1 is formed on the buffer layer BF. The buffer layer BF may include any one of an inorganic insulation material and/or an organic insulation material. The inorganic insulation material may include an inorganic insulation material such as SiOx, SiNx, SiON, and SiOF, and may be a single layer or multiple layers including at least one of these materials. The buffer layer BF may prevent an impurity, which may be provided from the substrate SUB during a manufacturing process, from flowing into elements formed on the substrate SUB.

After a layer including a crystalline semiconductor material is formed on the substrate SUB, by patterning, the first semiconductor layer AL1 may be formed. At this point, the crystalline semiconductor material may be formed through a crystallization operation for crystallizing a semiconductor material.

The first semiconductor layer AL1 may be divided into a first channel part CH1, and first and second contact parts OCT1 and OCT2 through a doping process or a reduction process. The first channel part CH1 is a channel area of the first transistor T1. The first semiconductor layer AL1 may include LTPS. The first and second contact parts OCT1 and OCT2 may be areas doped by injecting an impurity. The impurity injected to the first and second contact parts OCT1 and OCT2 may vary according to a type of the first transistor T1. The first transistor T1 may be an N type transistor or a P type transistor. When the first transistor T1 is an N type transistor, the first and second contact parts OCT1 and OCT2 may be an area doped with an n+ dopant, and when the first transistor T1 is a P type transistor, the first and second contact parts OCT1 and OCT2 may be an area doped with a p+ dopant. The first channel part CH1 is formed between the first and second contact parts OCT1 and OCT2.

Figure 8B:
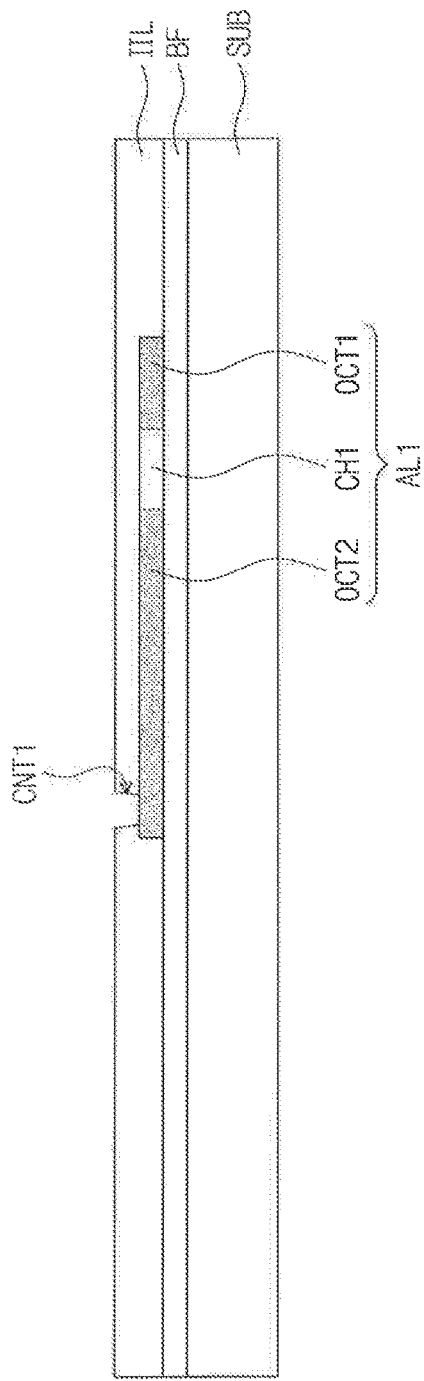

Referring to FIG. 8B, the first semiconductor layer AL1 is covered by an interlayer insulation layer IIL. In an exemplary embodiment of the inventive concept, the interlayer insulation layer IIL may include an inorganic insulation material such as SiOx, SiNx, SiON, and SiOF or an organic insulation material, and may be a single layer or multiple layers including at least one of these materials. A first contact hole CNT1 for exposing the second contact part OCT2 is formed in the interlayer insulation layer IIL.

Referring to FIG. 8C, a second semiconductor layer AL2 and the first control electrode GAT1 of the first transistor T1 are formed on the interlayer insulation layer IIL. The second semiconductor layer AL2 includes an oxide semiconductor.

The second semiconductor layer AL2 may be formed through a photolithography process. The second semiconductor layer AL2 may be formed through a hydrogen reduction process.

The second semiconductor layer AL2 may include the second channel part CH2 and the third and fourth contact parts OCT3 and OCT4. Here, the third and fourth contact parts OCT3 and OCT4 of the second semiconductor layer AL2 may be an area processed with hydrogen plasma during the hydrogen reduction process. The second channel part CH2 is formed between the third and fourth contact parts OCT3 and OCT4.

When a portion of the second contact part OCT2 is exposed by the first contact hole CNT1 of the interlayer insulation layer IIL, at least one of the third and fourth contact parts OCT3 and OCT4 may directly contact the second contact part OCT2 via the first contact hole CNT1. For example, the fourth contact part OCT4 directly contacts the second contact part OCT2 via the first contact hole CNT1. Additionally, at a portion of the first contact hole CNT1, the fourth contact part OCT4 may be disposed to overlap the second contact part OCT2. In other words, a portion of the first semiconductor layer AL1 and a portion of the second semiconductor layer AL2 may overlap each other.

After a conductive material is formed on the interlayer insulation layer IIL, by patterning, the first control electrode GAT1 may be formed.

The first control electrode GAT1 of the first transistor T1 may be disposed to face the first channel part CH1 of the first semiconductor layer AL1. The first control electrode GAT1 may be utilized as a first electrode of the storage capacitor Cst. When the first control electrode GAT1 is utilized as the first electrode of the storage capacitor Cst, the size of the first control electrode GAT1 may be formed according to the desired capacitance of the storage capacitor Cst. In other words, the size of the first control electrode GAT1 may vary depending on the capacitance of the storage capacitor Cst.

Referring to FIG. 8D, the first control electrode GAT1 and the second semiconductor layer AL2 are covered by the first insulation layer IL1. The first insulation layer IL1 may include an inorganic insulation material such as SiOx, SiNx, SiON, and SiOF or an organic insulation material, and may be a single layer or multiple layers including at least one of these materials. As shown in FIG. 8E, the second to sixth control electrodes of the second to sixth transistors T2 to T6 and the second electrode GAT2 of the storage capacitor Cst are formed on the first insulation layer IL1. Each of the second to sixth control electrodes is disposed at a corresponding upper part of the second channel part CH2 of the second semiconductor layer AL2. Additionally, the second electrode GAT2 of the storage capacitor Cst is disposed to face the first control electrode GAT1 with the first insulation layer IL1 therebetween.

The hydrogen reduction process of the second semiconductor layer AL2 may be performed by using each of the second to sixth control electrodes as a mask. In such a case, an area (in other words, the second channel part OCT2) facing the second to sixth control electrodes is not processed with hydrogen plasma and only the remaining areas are processed with hydrogen plasma. Therefore, the area may be formed as the third and fourth contact parts OCT3 and OCT4.

Additionally, the i-th scan line SLi, the i-th light emitting line ELi, the (i−1)th light emitting line ELi−1, and the initialization line RL, shown in FIG. 3, may be formed on the first insulation layer IL1.

Figure 8F:
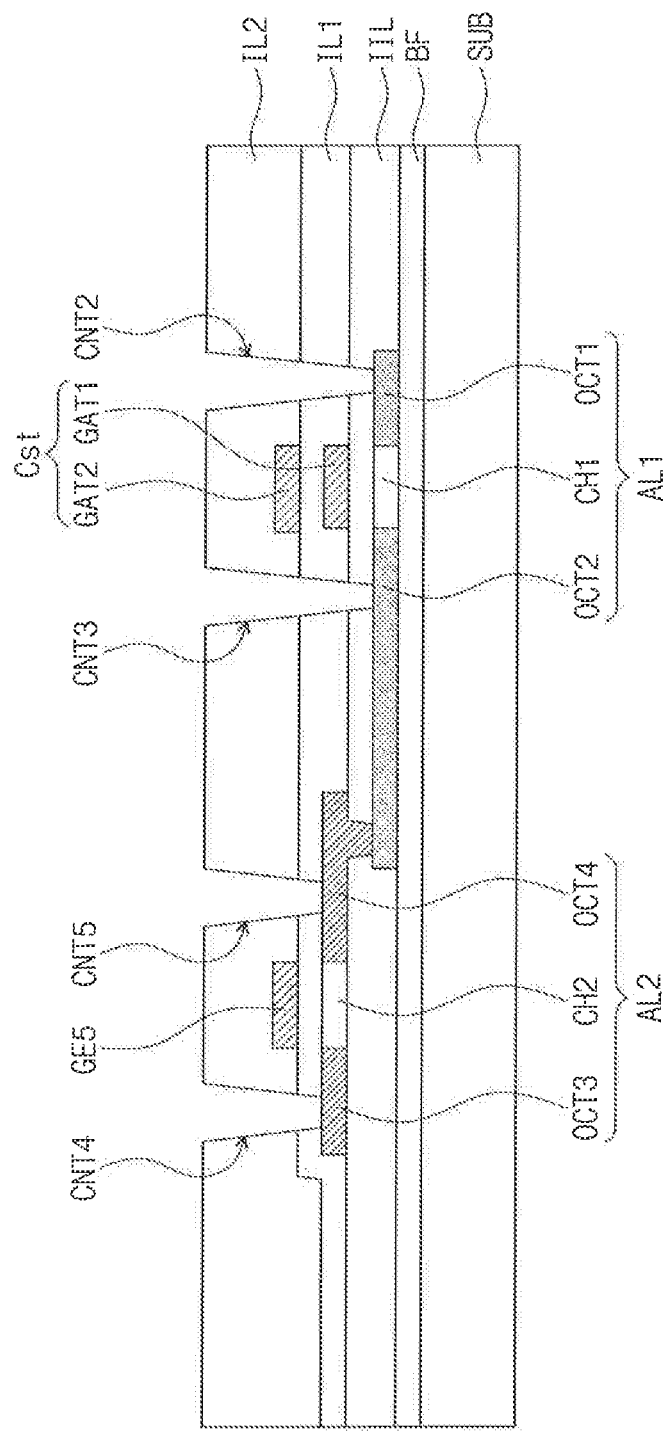

Referring to FIG. 8F, the second to sixth control electrodes of the second to sixth transistors T2 to T6 and the second electrode GAT2 of the storage capacitor Cst are covered by the second insulation layer IL2. The second insulation layer IL2 may be a single layer or multiple layers including at least one of an inorganic insulation material and an organic insulation material. The inorganic insulation material may include at least one of SiOx, SiNx, SiON, and SiOF.

Second and third contract holes CNT2 and CNT3 penetrating the interlayer insulation layer IIL and the first and second insulation layers IL1 and IL2 to expose the first and second contact parts OCT1 and OCT2 are formed in the interlayer insulation layer IIL and the first and second insulation layers IL1 and IL2. Fourth and fifth contract holes CNT4 and CNT5 penetrating the first and second insulation layers IL1 and IL2 to expose the third and fourth contact parts OCT3 and OCT4 are formed in the first and second insulation layers IL1 and IL2.

Figure 8G:
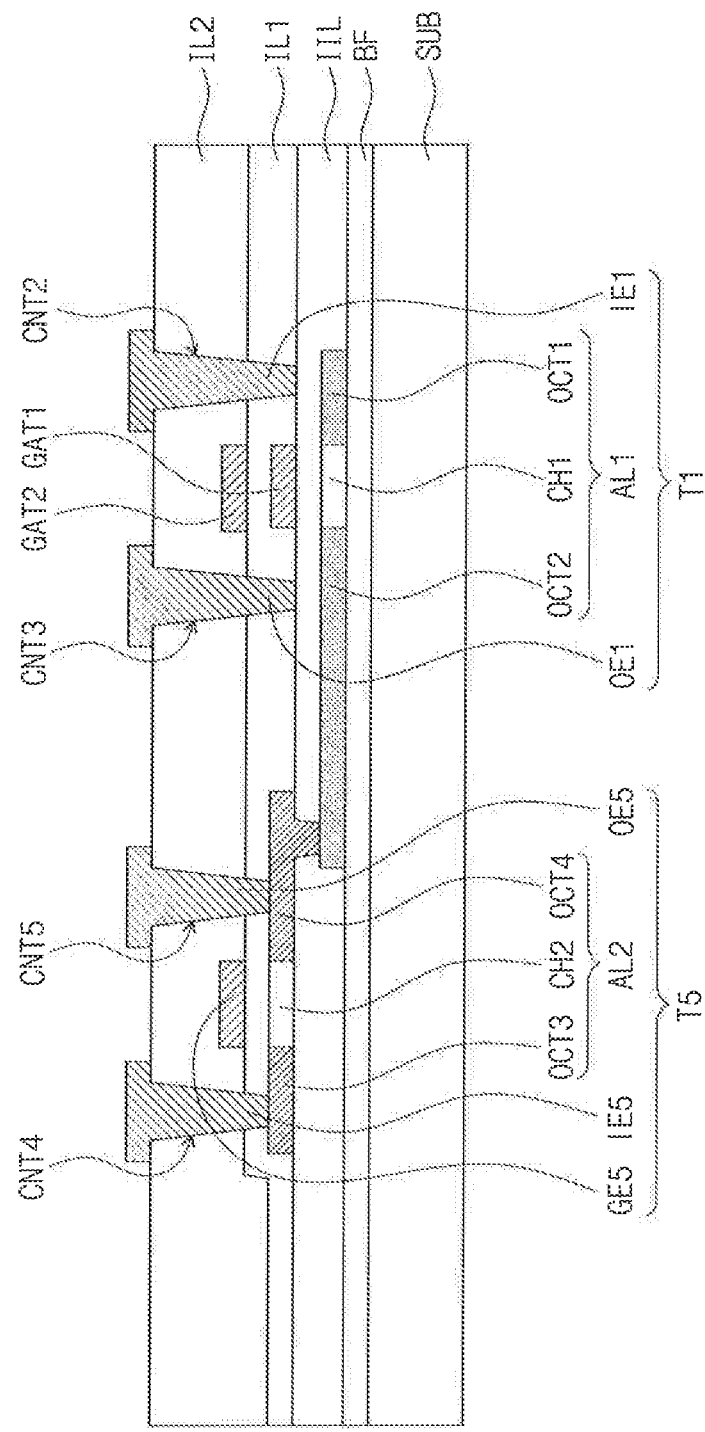

Referring to FIG. 8G, the first input electrode IE1 and the first output electrode OE1 of the first transistor T1 are formed on the second insulation layer IL2. The first input electrode IE1 contacts the first contact part OCT1 via the second contact hole CNT2 and the first output electrode OE1 contacts the second contact part OCT2 via the third contact hole CNT3.

The second to sixth input electrodes and the second to sixth output electrodes of the second to sixth transistors T2 to T6 are formed on the second insulation layer IL2. As shown in FIG. 8G, the fifth input electrode IE5 and the fifth output electrode OE5 of the fifth transistor T5 among the second to sixth transistors T2 to T6 contact the third and fourth contact parts OCT3 and OCT4, respectively, via the fourth and fifth contact holes CNT4 and CNT5.

Additionally, the k-th data line DLK (see FIG. 3) and the power line PL (see FIG. 3) may be formed on the second insulation layer IL2.

This way, in a structure where different types of transistors are to be electrically connected to each other, contact parts of the first and second semiconductor layers AL1 and AL2 are directly contacted. Accordingly, a separate bridge electrode for connecting transistors each other may be omitted. Additionally, by employing a direct contact structure that utilizes a contact part of a semiconductor layer, it is possible to increase the utilization of a pixel design space, and as a result, it is possible to increase a design margin or an aperture ratio.

In an organic light emitting display device and a method of manufacturing the same according to an exemplary embodiment of the inventive concept, two types of transistors may be connected electrically by directly contacting contact parts in a semiconductor layer of each transistor.

Although the inventive concept has been shown and described with reference to exemplary embodiments thereof, it is understood by those of ordinary skill in the art that various changes in form and detail can be made thereto without departing from the spirit and scope of the inventive concept as hereinafter claimed.

What is claimed is:
1. An organic light emitting display device, comprising:
   an organic light emitting diode comprising an anode and a cathode;
   a driving transistor comprising a first semiconductor layer, wherein the driving transistor is electrically connected to the anode of the organic light emitting diode; and a control transistor comprising a second semiconductor layer including a different material from the first semiconductor layer and configured to control the driving transistor, wherein the first semiconductor layer comprises a first channel part, and first and second contact parts spaced apart from each other with the first channel part therebetween, the second semiconductor layer comprises a second channel part, and third and fourth contact parts spaced apart from each other with the second channel part therebetween, and one of the first and second contact parts directly contacts one of the third and fourth contact parts.

2. The organic light emitting display device of claim 1, wherein the first and second semiconductor layers are disposed on different layers from each other.

3. The organic light emitting display device of claim 2, further comprising an interlayer insulation layer interposed between the first and second semiconductor layers, wherein a contact hole exposing a portion of one of the third and fourth contact parts is disposed in the interlayer insulation layer and one of the first and second contact parts directly contacts one of the third and fourth contact parts via the contact hole.

4. The organic light emitting display device of claim 3, wherein the driving transistor comprises a first control electrode, a first input electrode connected to the first contact part, and a first output electrode connected to the second contact part, the control transistor comprises a plurality of transistors; and at least one of the plurality of transistors comprises a second control electrode, an input electrode connected to the third contact part, and an output electrode connected to the fourth contact part.

5. The organic light emitting display device of claim 4, wherein the first control electrode of the driving transistor overlaps the first semiconductor layer and the second control electrode of a first transistor of the plurality of transistors overlaps the second semiconductor layer.

6. The organic light emitting display device of claim 5, further comprising a storage capacitor connected to the driving transistor, wherein the storage capacitor comprises a first electrode and a second electrode disposed to face the first electrode, wherein the first electrode of the storage capacitor is the first control electrode of the driving transistor.

7. The organic light emitting display device of claim 5, wherein the second semiconductor layer is disposed on the interlayer insulation layer and the second control electrode of the first transistor of the plurality of transistors is disposed to face the second channel part of the second semiconductor layer.

8. The organic light emitting display device of claim 7, wherein the first semiconductor layer comprises low temperature polysilicon and the second semiconductor layer comprises an oxide semiconductor.

9. The organic light emitting display device of claim 1, wherein the control transistor comprises an oxide semiconductor as the second semiconductor layer.

10. The organic light emitting display device of claim 9, wherein the driving transistor comprises polysilicon as the first semiconductor layer and the driving transistor is a P type transistor or an N type transistor.

11. The organic light emitting display device of claim 1, further comprising:

a data line configured to receive a data voltage;
a power line configured to receive a power voltage;
a scan line configured to receive a scan signal;
a first light emitting line configured to receive a first light emitting control signal;
a second light emitting line configured to receive a second light emitting control signal; and
an initialization line configured to receive an initialization voltage.

12. The organic light emitting display device of claim 11, wherein the control transistor comprises second, third, fourth, fifth and sixth transistors.

13. The organic light emitting display device of claim 12, wherein the second transistor comprises a second control electrode connected to the scan line, a second output electrode connected to a first input electrode of the driving transistor at a first node, and a second input electrode connected to a first control electrode of the driving transistor at a third node;

the third transistor comprises a third control electrode connected to the first light emitting line, a third input electrode configured to receive a power voltage, and a third output electrode connected to the first input electrode of the driving transistor at the first node;

the fourth transistor comprises a fourth control electrode connected to the scan line, a fourth input electrode connected to the data line, and a fourth output electrode connected to a fourth node;

the fifth transistor comprises a fifth control electrode connected to the second light emitting line, a fifth input electrode connected to the fourth node, and a fifth output electrode connected to the second node; and the sixth transistor comprises a sixth control electrode connected to the scan line, a sixth input electrode connected to the initialization line, and a sixth output electrode connected to the anode of the organic light emitting diode.

14. The organic light emitting display device of claim 13, further comprising a storage capacitor disposed between the third node and the fourth node.

15. The organic light emitting display device of claim 13, wherein the first contact part of the driving transistor directly contacts a fourth contact part of one of the second and third transistors.

16. The organic light emitting display device of claim 13, wherein the second contact part of the driving transistor directly contacts a fourth contact part of one of the fifth and sixth transistors.

17. The organic light emitting display device of claim 1, wherein a portion of the first semiconductor layer overlaps a portion of the second semiconductor layer.

18. A display device, comprising:

a light emitting element comprising a first terminal and a second terminal;

a first transistor comprising a first semiconductor layer, wherein the first transistor is electrically connected to the first terminal of the light emitting element; and a second transistor comprising a second semiconductor layer including a different material from the first semiconductor layer and configured to control the first transistor, wherein a first contact part of the first semiconductor layer directly contacts a second contact part of the second semiconductor layer.

19. The display device of claim 18, wherein an output terminal of the first transistor is electrically connected to an output terminal of the second transistor via the direct connection of the first and second contact parts.

20. The display device of claim 18, wherein the light emitting element is an organic light emitting diode.

\* \* \* \* \*